United States Patent
Chen et al.

(10) Patent No.: US 12,100,789 B2
(45) Date of Patent: Sep. 24, 2024

(54) DISPLAY DEVICE

(71) Applicant: Coretronic Corporation, Hsin-Chu (TW)

(72) Inventors: Ping-Yen Chen, Hsin-Chu (TW); Wen-Chun Wang, Hsin-Chu (TW); Chung-Yang Fang, Hsin-Chu (TW); Yu-Fan Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 404 days.

(21) Appl. No.: 17/526,975

(22) Filed: Nov. 15, 2021

(65) Prior Publication Data

US 2022/0181528 A1      Jun. 9, 2022

Related U.S. Application Data

(60) Provisional application No. 63/121,244, filed on Dec. 4, 2020.

(30) Foreign Application Priority Data

Jan. 29, 2021   (CN) .......................... 202110123912.8

(51) Int. Cl.
  *H01L 33/38*   (2010.01)
  *H01L 27/15*   (2006.01)
  *H01L 33/50*   (2010.01)

(52) U.S. Cl.
  CPC .......... *H01L 33/505* (2013.01); *H01L 27/156* (2013.01); *H01L 33/382* (2013.01)

(58) Field of Classification Search
  CPC .... H01L 27/156; H01L 33/505; H01L 33/382
  (Continued)

(56) References Cited

U.S. PATENT DOCUMENTS

| 6,950,159 | B2* | 9/2005 | Kubo | G02F 1/134309 |
| | | | | 349/114 |
| 2020/0273918 | A1* | 8/2020 | Bang | H10K 59/38 |
| 2022/0052301 | A1* | 2/2022 | Xu | G02B 5/287 |

FOREIGN PATENT DOCUMENTS

| CN | 104698524 | 6/2015 |
| CN | 108288640 | 7/2018 |

(Continued)

OTHER PUBLICATIONS

Office Action of Taiwan Counterpart Application, issued on Nov. 29, 2021, pp. 1-3.

*Primary Examiner* — Christopher M Raabe
(74) *Attorney, Agent, or Firm* — JCIPRNET

(57) ABSTRACT

A display device, including a circuit substrate, a light-emitting layer, a quarter-wave plate, and a band-pass polarizing layer, is provided. The light-emitting layer is disposed on the circuit substrate and has light-emitting structures, which are electrically connected to the circuit substrate and include first light-emitting structures, which have a first main light-emitting wavelength. The quarter-wave plate is disposed in overlap with the light-emitting structures and is located between the band-pass polarizing layer and the light-emitting layer. The band-pass polarizing layer includes at least one first band-pass polarizing pattern, which have a first absorption axis. The first wavelength range is the first main light-emitting wavelength±10 nm. An average transmittance of the first band-pass polarizing patterns to light with a wavelength outside the first wavelength range and a polarization direction parallel to the first absorption axis is less than 20%.

12 Claims, 11 Drawing Sheets

(58) Field of Classification Search
USPC .......................................................... 313/506
See application file for complete search history.

(56) References Cited

FOREIGN PATENT DOCUMENTS

| | | |
|---|---|---|
| TW | 201300888 | 1/2013 |
| TW | M570991 | 12/2018 |

* cited by examiner

DISPLAY DEVICE

CROSS-REFERENCE TO RELATED APPLICATION

This application claims the priority benefit of U.S. application Ser. No. 63/121,244, filed on Dec. 4, 2020 and China application serial no. 202110123912.8, filed on Jan. 29, 2021. The entirety of each of the above-mentioned patent applications is hereby incorporated by reference herein and made a part of this specification.

BACKGROUND

Technical Field

The invention relates to an electronic device, and particularly relates to a display device.

Description of Related Art

In recent years, organic light-emitting diode (OLED) display panels and micro LED display panels have gradually become popular due to their high color saturation, fast response time, and high contrast display quality. In order to increase light-emitting efficiency of such self-luminous display panels, most of electrodes of LEDs on a side away from a light-emitting surface are reflective electrodes. Since such reflective electrodes may reflect external ambient light, when the display panel displays an entire black image or a partial dark image, human eyes may easily perceive the external ambient light reflected by the reflective electrodes, which causes degradation of display quality.

In order to solve the aforementioned problem, a technical solution of arranging a circular polarizer on the side of the light-emitting surface of the self-luminous display panel has been proposed. By arranging the circular polarizer, the passing external ambient light forms circularly polarized light with a specific rotation characteristic, and the circularly polarized light is reflected by the reflective electrode to form circularly polarized light with an opposite rotation characteristic, and such circularly polarized light with the opposite rotation characteristic cannot pass through the circular polarizer. In this way, reflectivity of such self-luminous display panels to external ambient light is reduced. However, the circular polarizer may reduce an overall light output of the self-luminous display panel, for example, cause attenuation of at least 55% of a light output brightness.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention is directed to a display device, which takes both of a light energy utilization rate and dark state contrast into consideration.

In order to achieve one or a portion of or all of the objects or other objects, an embodiment of the invention provides a display device. The display device includes a circuit substrate, a light-emitting layer, a quarter-wave plate, and a band-pass polarizing layer. The light-emitting layer is disposed on the circuit substrate and has a plurality of light-emitting structures. The light-emitting structures are disposed in overlap with the circuit substrate, and are electrically connected to the circuit substrate. The light-emitting structures include a plurality of first light-emitting structures. The first light-emitting structures have a first main light-emitting wavelength. The quarter-wave plate is disposed in overlap with the light-emitting structures of the light-emitting layer. The band-pass polarizing layer is disposed in overlap with the quarter-wave plate. The quarter-wave plate is located between the band-pass polarizing layer and the light-emitting layer. The band-pass polarizing layer includes at least one of first band-pass polarizing patterns. The first band-pass polarizing patterns has a first absorption axis. The first wavelength range is the first main light-emitting wavelength±10 nm, and within a range of visible light, the average transmittance of the first band-pass polarizing patterns to light with a wavelength being outside the first wavelength range and a polarization direction being parallel to the first absorption axis is less than 20%.

Based on the above description, in the display device of an embodiment of the invention, the side of the quarter-wave plate away from the light-emitting layer is provided with the band-pass polarizing layer. The at least one of first band-pass polarizing pattern of the band-pass polarizing layer have an average transmittance of greater than 50% to the light within a specific wavelength range, while in the visible light range, the first band-pass polarizing patterns have an average transmittance of less than 20% to the light with a wavelength being outside the specific wavelength range and a polarization direction being parallel to the absorption axis of the first band-pass polarizing patterns, and have a polarizing effect to the light. In this way, in addition to increasing an overall light output of the display device, an overall reflectivity of the display device to external ambient light is also reduced, thereby improving the light energy utilization rate and a dark state performance of the display device.

Other objectives, features and advantages of the present invention will be further understood from the further technological features disclosed by the embodiments of the present invention wherein there are shown and described preferred embodiments of this invention, simply by way of illustration of modes best suited to carry out the invention.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "left," "right," "front," "back," etc., is used with reference to the orientation of the Figure(s) being described and are not intended to be limiting of the invention.

Figure 1A:
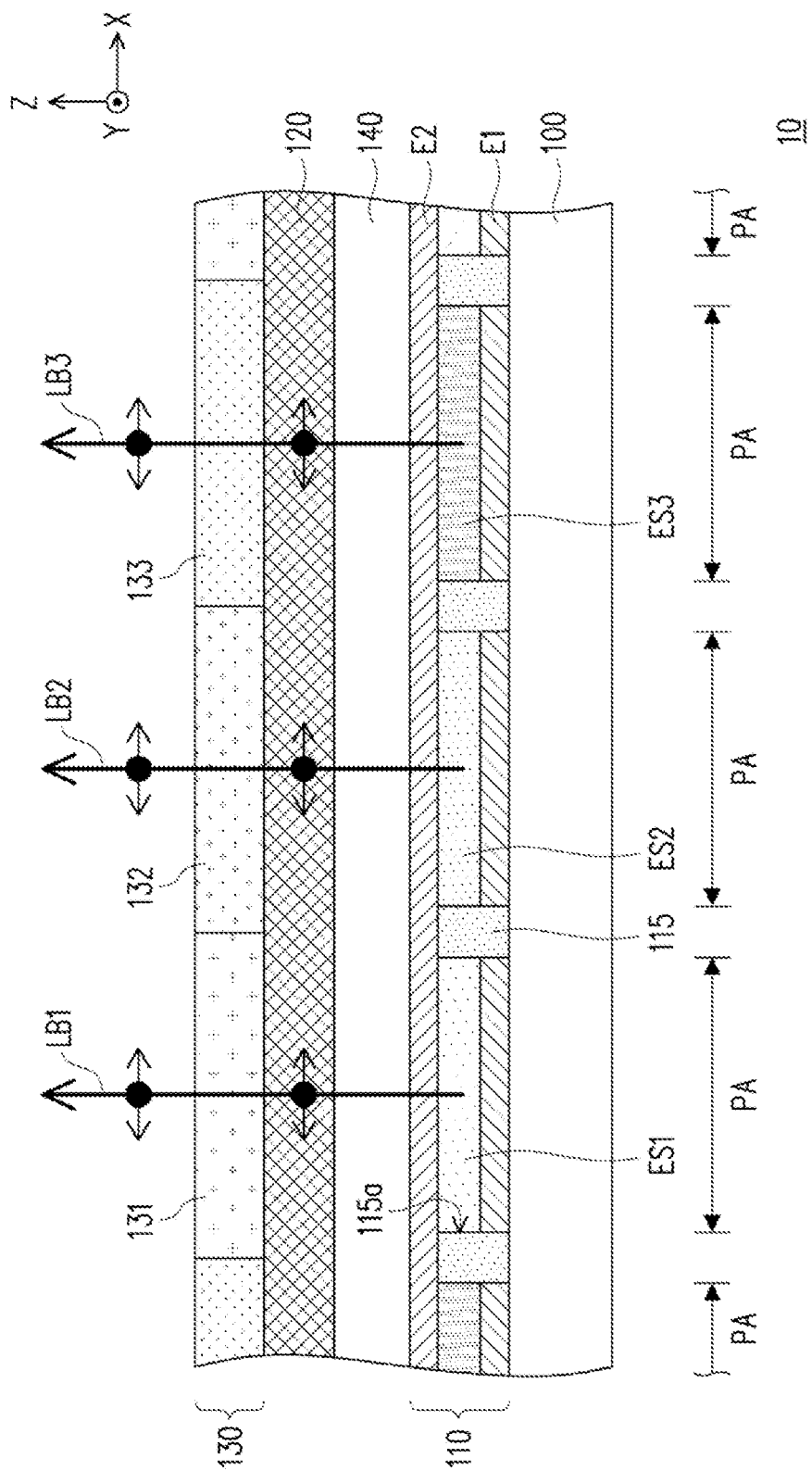
FIG. 1A and FIG. 1B are schematic cross-sectional views of a display device functioning on excitation light and external ambient light according to a first embodiment of the invention.
Figure 1B:
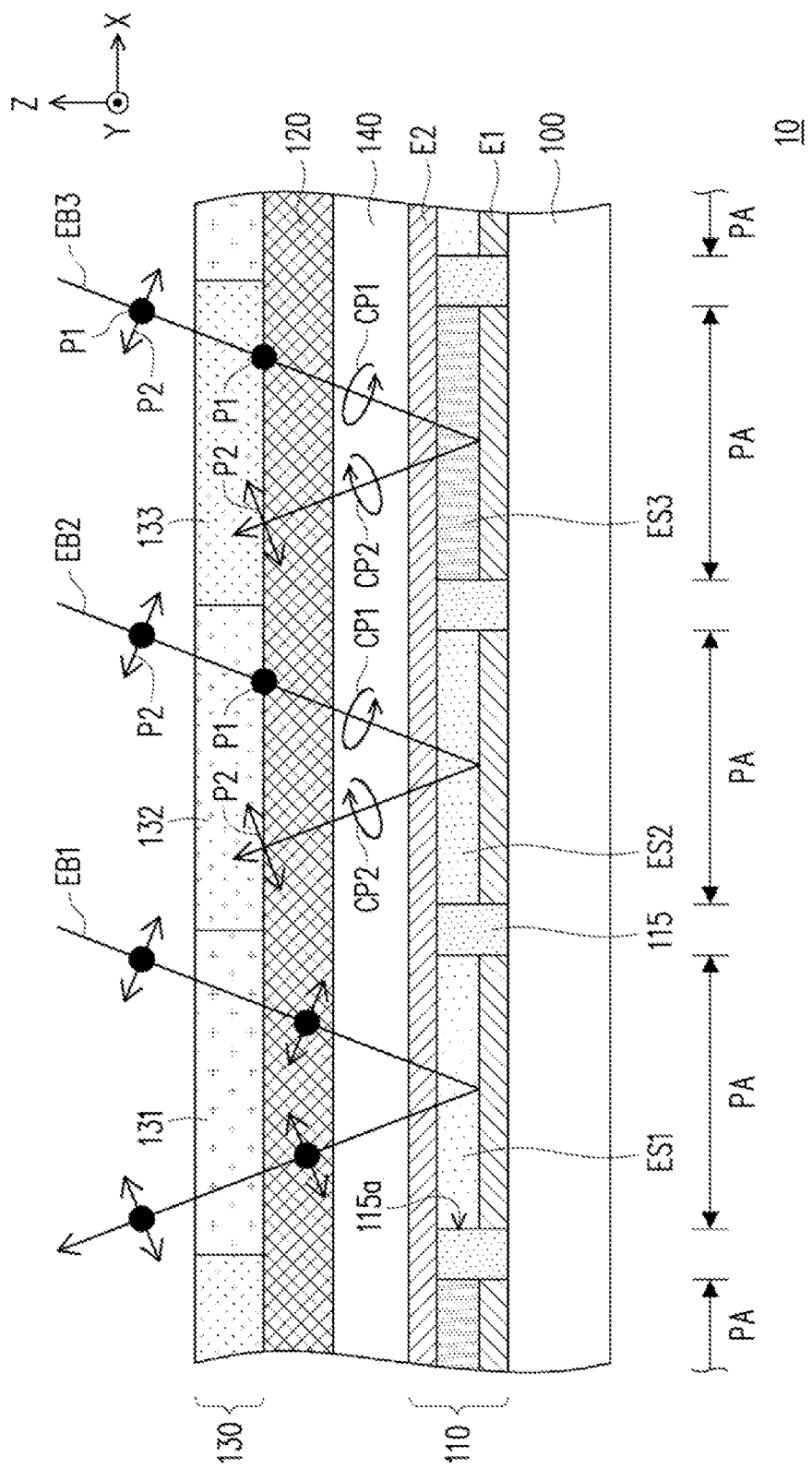
Figure 2:
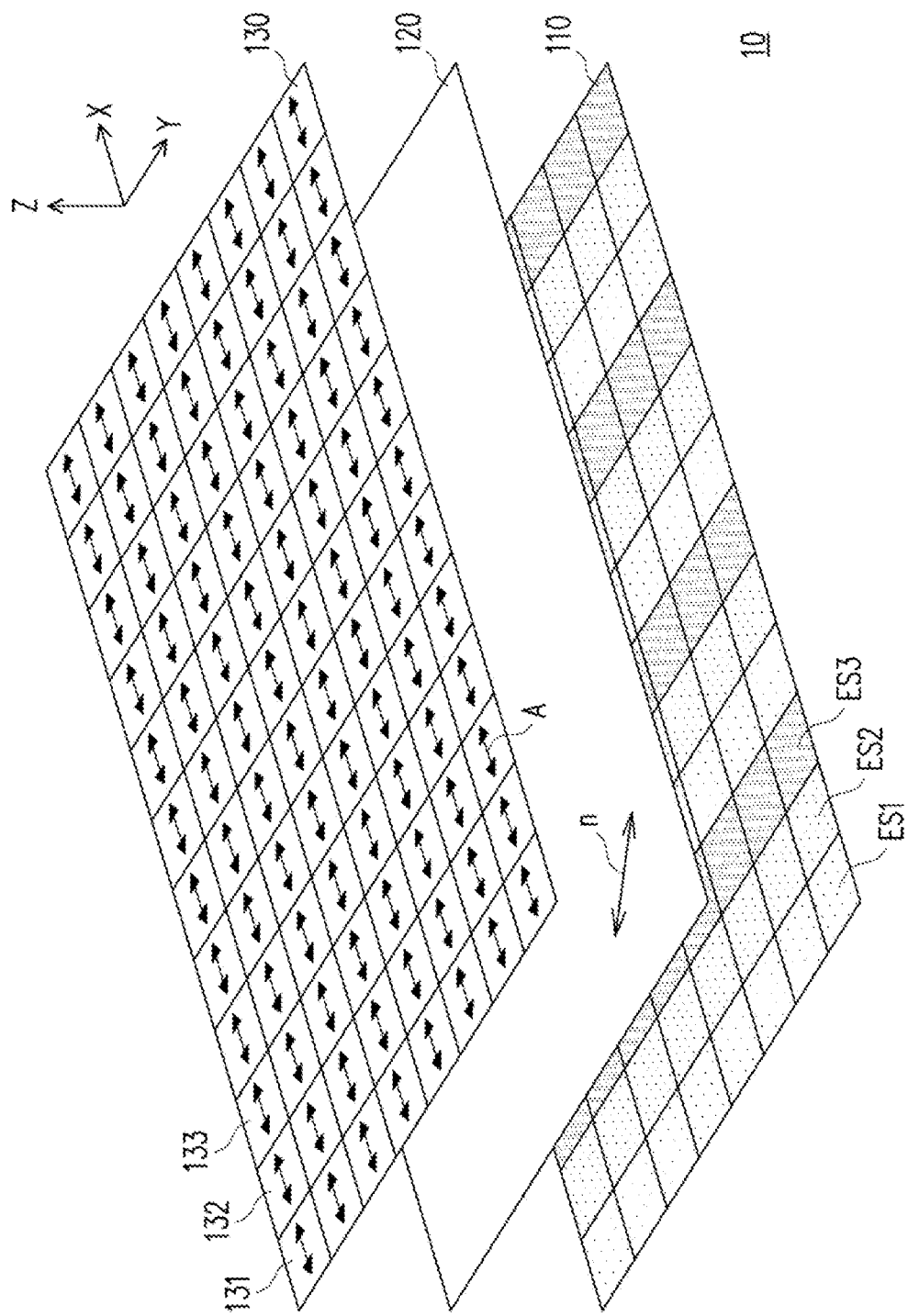
FIG. 2 is a schematic diagram of a part of film layers of the display device of FIG. 1A.
Figure 3:
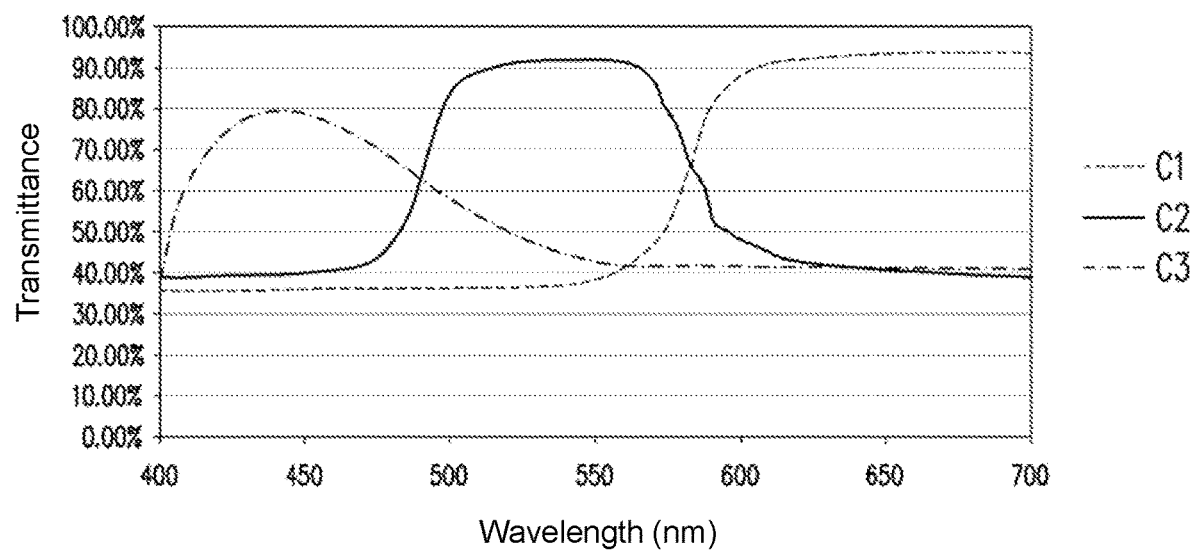
FIG. 3 is a transmittance-wavelength curve diagram of a band-pass polarizing layer of FIG. 1A.
Figure 4:
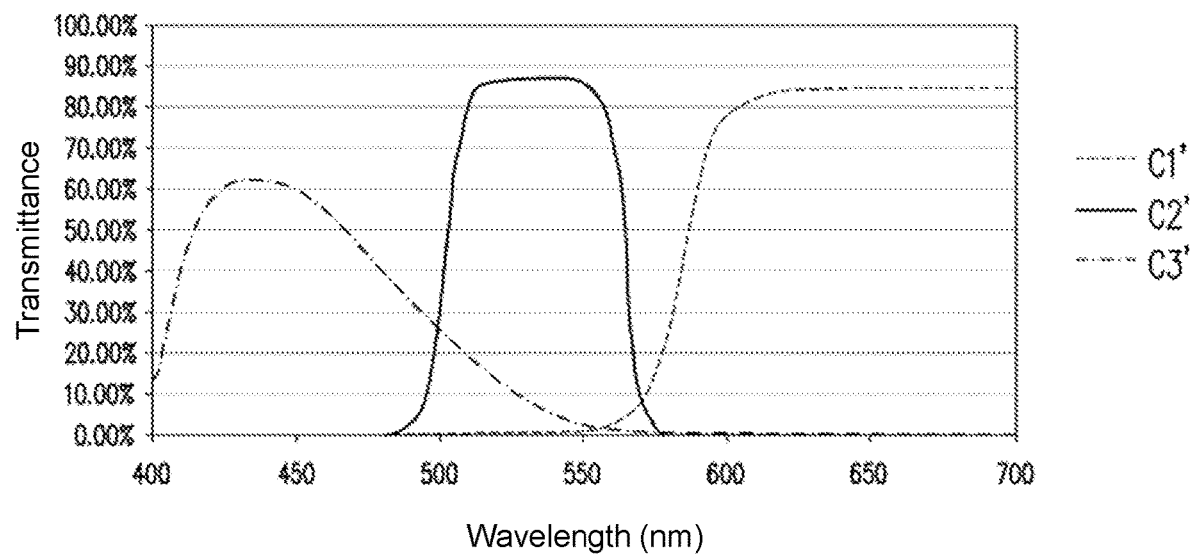
FIG. 4 is a transmittance-wavelength curve diagram of a combination of the band-pass polarizing layer and a quarter-wave plate of FIG. 1A when the external ambient light passes through the combination twice.
Figure 5:
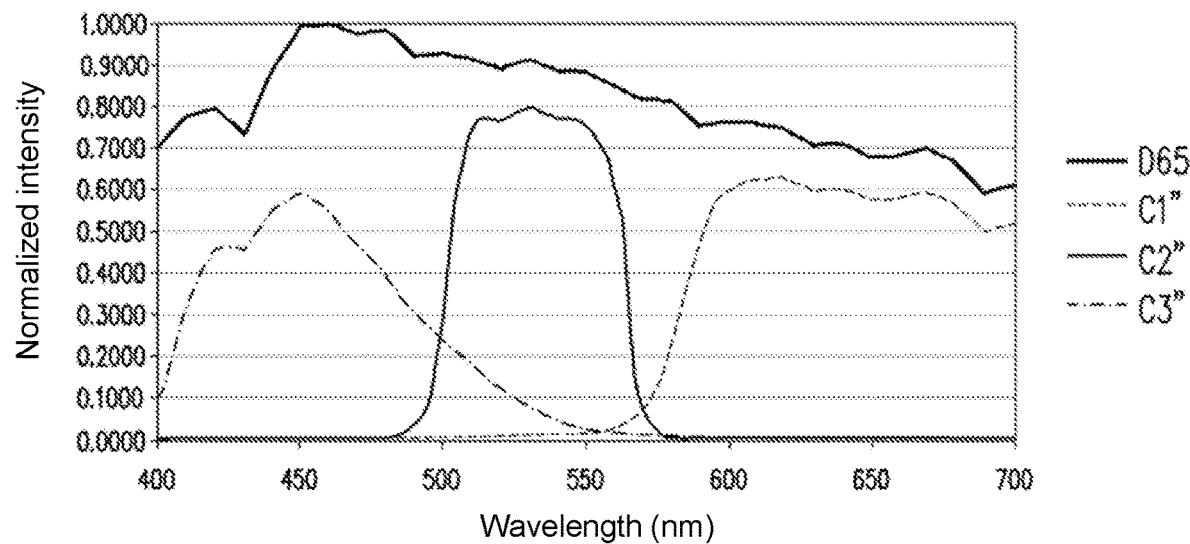
FIG. 5 a transmittance-wavelength curve diagram of a combination of the band-pass polarizing layer and the quarter-wave plate of FIG. 1A when light of a D65 light source passes through the combination twice.
Figure 6:
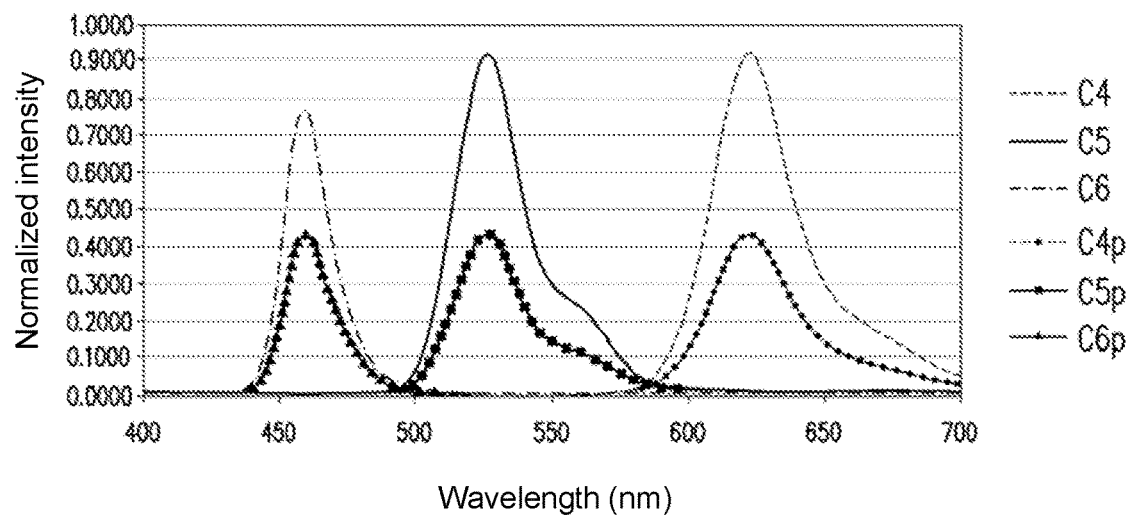
FIG. 6 is a transmittance-wavelength curve diagram of the combination of the band-pass polarizing layer and the quarter-wave plate of FIG. 1A and a circular polarizer of a comparison example.

FIG. 1A and FIG. 1B are schematic cross-sectional views of a display device functioning on excitation light and external ambient light according to a first embodiment of the invention. FIG. 2 is a schematic diagram of a part of film layers of the display device of FIG. 1A. FIG. 3 is a transmittance-wavelength curve diagram of a band-pass polarizing layer of FIG. 1A. FIG. 4 is a transmittance-wavelength curve diagram of a combination of the band-pass polarizing layer and a quarter-wave plate of FIG. 1A when the external ambient light passes through the combination twice. FIG. 5 a transmittance-wavelength curve diagram of a combination of the band-pass polarizing layer and the quarter-wave plate of FIG. 1A when light of a D65 light source passes through the combination twice. FIG. 6 is a transmittance-wavelength curve diagram of the combination of the band-pass polarizing layer and the quarter-wave plate of FIG. 1A and a circular polarizer of a comparison example.

Referring to FIG. 1A, FIG. 1B and FIG. 2, the display device 10 includes a circuit substrate 100, a light-emitting layer 110, a quarter-wave plate 120 and a band-pass polarizing layer 130. The light-emitting layer 110 is disposed on the circuit substrate 100. The light-emitting layer 110 has a plurality of light-emitting structures disposed in overlap with the circuit substrate 100, and the light-emitting structures are electrically connected to the circuit substrate 100. In the embodiment, the circuit substrate 100, for example, includes a driving circuit layer that may individually control a plurality of display pixels. Correspondingly, the light-emitting layer 110 may include a plurality of first light-emitting structures ES1, a plurality of second light-emitting structures ES2, a plurality of third light-emitting structures ES3, an isolation structure layer 115, a first electrode layer E1, and a second electrode layer E2. The isolation structure layer 115 has a plurality of openings 115a. The first light-emitting structures ES1, the second light-emitting structures ES2, and the third light-emitting structures ES3 are sequentially arranged in alternation along, for example, a direction X, and are respectively disposed in the openings 115a. A plurality of light-emitting structures arranged along a direction Y are, for example, a same type of light-emitting structures. The openings 115a of the isolation structure layer 115 may define a plurality of pixel areas PA of the display device 10, and the first light-emitting structures ES1, the second light-emitting structures ES2, and the third light-emitting structures ES3 located in the pixel areas PA may serve as display pixels (sub-pixels), but the invention is not limited thereto. In other embodiments, the display device 10 may be a monochrome grayscale display or a black and white grayscale display, which means that the display device 10 may only include one type of light-emitting structure.

For example, the first light-emitting structure ES1, the second light-emitting structure ES2, and the third light-emitting structure ES3 are adapted to respectively emit excitation light with different main light-emitting wavelengths, such as red light (for example, light with a main light-emitting wavelength greater than 600 nm), green light (for example, light with a main light-emitting wavelength between 500 nm and 600 nm) and blue light (for example, light with a main light-emitting wavelength less than 500 nm), and these lights are mixed with different light intensity ratios to achieve an effect of color display. In other words, the display device 10 of the embodiment is a self-luminous display, such as an organic light-emitting diode (OLED) display, but the invention is not limited thereto. In other embodiments, the display device 10 may also be a micro light-emitting diode (micro-LED) display or a mini light-emitting diode (mini-LED) display.

In the embodiment, the first electrode layer E1 and the second electrode layer E2 are respectively disposed on two opposite sides of the plurality of light-emitting structures, and the two electrode layers are electrically connected to the light-emitting structures. For example, the first electrode layer E1 is located between the light-emitting structures and the circuit substrate 100, and has a plurality of electrode patterns. The electrode patterns are respectively disposed in overlap with the light-emitting structures (i.e., respectively disposed in the openings 115a), and are respectively electrically connected to a plurality of active devices (not shown) of the circuit substrate 100. The second electrode layer E2 is, for example, a full-surface electrode covering the light-emitting structures and the isolation structure layer 115. More specifically, currents flowing through the light-emitting structures may be individually controlled by the active devices to generate same or different light intensities in different pixel areas PA.

The first electrode layer E1 is, for example, a reflective electrode layer. A material of the reflective electrode layer includes metals, alloys, nitrides of metal materials, oxides of metal materials, oxynitrides of metal materials, or other suitable materials, or a stacked layer of metal materials and other conductive materials. The second electrode layer E2 is, for example, a light-transmissive electrode layer, and a material of the light-transmissive electrode layer includes metal oxides, such as indium tin oxide, indium zinc oxide, aluminum tin oxide, aluminum zinc oxide, or other suitable oxides, or a stacked layer of at least two of the above materials.

The quarter-wave plate 120 of the display device 10 is disposed in overlap with the plurality of light-emitting structures (such as the first light-emitting structures ES1, the second light-emitting structures ES2, and the third light-emitting structures ES3) of the light-emitting layer 110 and the band-pass polarizing layer 130, and is located between the band-pass polarizing layer 130 and the light-emitting layer 110. It should be noted that the quarter-wave plate of the invention may be a combination of multilayer compensation films, such as a quarter-wave plate and a half-wave plate. In the embodiment, the band-pass polarizing layer 130 may include a plurality of first polarizing patterns, for example, a plurality of band-pass polarizing patterns 131, a plurality of band-pass polarizing patterns 132, and a plurality of band-pass polarizing patterns 133, and the band-pass polarizing patterns 131, the band-pass polarizing patterns 132 and the band-pass polarizing patterns 133 are respectively overlapped with the first light-emitting structures ES1, the second light-emitting structures ES2, and the third light-emitting structures ES3 of the light-emitting layer 110 in a direction Z, but the invention is not limited thereto. Namely, the band-pass polarizing patterns 131, the band-pass polarizing patterns 132, and the band-pass polarizing patterns 133 are also arranged in alternation along the direction X. It should be particularly noted that the display device 10 may also selectively include an encapsulation layer 140 disposed between the light-emitting layer 110 and the quarter-wave plate 120 to protect the light-emitting layer 110, but the invention is not limited thereto.

Further, in the embodiment, the band-pass polarizing patterns of the band-pass polarizing layer 130 all have an absorption axis A (as shown in FIG. 2) with a same axial direction, and an included angle between the axial direction of the absorption axis A and an axial direction of an optical axis n (as shown in FIG. 2) of the quarter-wave plate 120 is 45 degrees, but the invention not limited thereto. In other embodiments, the absorption axes of the band-pass polarizing patterns may have different axial directions, for example, an axial direction of the absorption axes of a part of the band-pass polarizing patterns 131 is perpendicular to an axial direction of the absorption axes of another part of the band-pass polarizing patterns 131. It should be particularly noted that an average transmittance of the band-pass polarizing patterns to light with wavelengths within their specific wavelength ranges is greater than 50%, which is preferably greater than 60%, and the specific wavelength range is a range of plus or minus 10 nm of the main light-emitting wavelength (i.e. the main light-emitting wavelength±10 nm) of the light-emitting structure corresponding to each band-pass polarizing pattern, but the invention is not limited thereto. In other embodiments, the wavelength range is a range of plus or minus 20 nm of the main light-emitting wavelength of the light-emitting structure corresponding to each band-pass polarizing pattern.

It should be particularly noted that after light coming from the light-emitting layer 110 and having a wavelength within a specific wavelength range passes through the band-pass polarizing pattern having the specific wavelength range, substantial polarization characteristics are not produced (non-polarized light), i.e., the band-pass polarizing pattern does not absorb the light within the specific wavelength range. On the other hand, within a range of visible light (for example, with a wavelength of 400 nm-700 nm), the average transmittance of each of the band-pass polarizing patterns to light with a wavelength being outside the specific wavelength range and a polarization direction being parallel to the absorption axis A of the band-pass polarizing pattern is less than 20%, which is preferably less than 10%. In other embodiments, within the range of visible light, the average transmittance of each of the band-pass polarizing patterns in at least another wavelength range (for example, the main light-emitting wavelength range of another light-emitting structure) is less than 50%, and after light with a wavelength outside the specific wavelength range passes through the band-pass polarizing pattern having the specific wavelength range, the light may have substantial polarization characteristics (i.e. polarized light).

For example, referring to FIG. 1 to FIG. 3 at the same time, in the embodiment, the main light-emitting wavelengths of the first light-emitting structures ES1, the second light-emitting structures ES2, and the third light-emitting structures ES3 are respectively 620 nm (for example, red light), 530 nm (for example, green light), and 460 nm (for example, blue light). Therefore, within the range of visible light, the average transmittance of the band-pass polarizing patterns 131 overlapped with the first light-emitting structures ES1 in the wavelength range of 620±10 nm is greater than 50% (for example, greater than 90%) (as shown by a curve C1 in FIG. 3). The average transmittance of the band-pass polarizing patterns 132 overlapped with the second light-emitting structures ES2 in the wavelength range of 530±10 nm is greater than 50% (for example, greater than 90%) (as shown by a curve C2 in FIG. 3). The average transmittance of the band-pass polarizing patterns 133 overlapped with the third light-emitting structures ES3 in the wavelength range of 460±10 nm is greater than 50% (for example, greater than 70%) (as shown by a curve C3 in FIG. 3). In other embodiments, the average transmittance of the band-pass polarizing patterns 131 overlapped with the first light-emitting structures ES1 in the wavelength range of 620±10 nm is greater than 50% (for example, greater than 70%), and the average transmittance thereof in the wavelength range of 530±10 nm and/or 460±10 nm (for example, the range of green light and/or blue light) is less than 50% (as shown by the curve C1 in FIG. 3). The average transmittance of the band-pass polarizing patterns 132 overlapped with the second light-emitting structures ES2 in the wavelength range of 530±10 nm is greater than 50% (for example, greater than 70%), and the average transmittance thereof in the wavelength range of 620±10 nm and/or 460±10 nm is less than 50% (as shown by the curve C2 in FIG. 3). The average transmittance of the band-pass polarizing patterns 133 overlapped with the third light-emitting structures ES3 in the wavelength range of 460±10 nm is greater than 50% (for example, greater than 70%), and the average transmittance thereof in the wavelength range of 620±10 nm and/or 530±10 nm is less than 50% (as shown by the curve C3 in FIG. 3).

When the display pixels of the display device 10 are enabled (as shown in FIG. 1), the aforementioned transmission spectral characteristics of the band-pass polarizing patterns 131, the band-pass polarizing patterns 132, and the band-pass polarizing patterns 133 make light LB1 emitted by the first light-emitting structures ES1 (for example, red light with a main light-emitting wavelength of 620 nm), light LB2 emitted by the second light-emitting structures ES2 (for example, green light with a main light-emitting wavelength of 530 nm), and light LB3 emitted by the third light-emitting structures ES3 (for example, blue light with a main light-emitting wavelength of 460 nm) to lose less light energy after passing through the band-pass polarizing patterns 131, the band-pass polarizing patterns 132, and the band-pass polarizing patterns 133, respectively, thereby increasing an overall light output of the display device 10.

Since in the range of visible light, the average transmittance of the band-pass polarizing pattern to light with a wavelength being outside the specific wavelength range and a polarization direction being parallel to the absorption axis A of the band-pass polarizing pattern is less than 20%, the light with a wavelength outside the specific wavelength range may have polarization characteristics after passing through the band-pass polarizing pattern. Namely, the band-pass polarizing pattern may have a polarizing effect for light with a wavelength being outside the specific wavelength range. For example, when the light from the second light-emitting structure ES2 and emitted at a larger angle (i.e., the light with an optical path largely deviating from the light LB2) passes through the band-pass polarizing pattern 131 or the band-pass polarizing pattern 133, substantial light energy loss is produced. In other words, through the arrangement of the band-pass polarizing patterns, crosstalk of light from different pixel areas PA may also be reduced, thereby improving clarity of a display image.

According to another aspect, the arrangement of the quarter-wave plate 120 and the band-pass polarizing layer 130 may also reduce overall reflectivity of the display device 10 to external ambient light. For example, referring to FIG. 1B, external ambient light EB1, external ambient light EB2, and external ambient light EB3 shown in FIG. 1B are, for example, red light having the same wavelength, and the external ambient light EB1, the external ambient light EB2 and the external ambient light EB3 are respectively incident to the band-pass polarizing pattern 131, the band-pass polarizing pattern 132, and the band-pass polarizing pattern 133. Since a wavelength of the external ambient light EB1 is within the specific wavelength range (for example, 620±10 nm) of the band-pass polarizing pattern 131, after the external ambient light EB1 passes through the band-pass polarizing pattern 131 and the quarter-wave plate 120 twice (incident to the display device 10 and reflected by the first electrode layer E1), the external ambient light EB1 is emitted from the display device 10.

Conversely, since a wavelength of the external ambient light EB2 is outside the specific wavelength range (for example, 530±10 nm) of the band-pass polarizing pattern 132, during the process of passing through the band-pass polarizing pattern 132, the light component with the polarization direction being parallel to the absorption axis A of the band-pass polarizing pattern 132 is absorbed. Therefore, the external ambient light EB2 has a first linear polarization state P1 after passing through the band-pass polarizing pattern 132. After the external ambient light EB2 with the first linear polarization state P1 passes through the quarter-wave plate 120, the polarization state thereof is further transformed into a first circular polarization state CP1 (for example, right-handed circular polarization). After being reflected by the first electrode layer E1, the first circular polarization state CP1 is transformed into a second circular polarization state CP2 with an opposite rotation characteristic (for example, left-handed circular polarization). After the external ambient light EB2 with the second circular polarization state CP2 passes through the quarter-wave plate 120, the second circular polarization state CP2 thereof is further transformed into a second linear polarization state P2 (a direction of the first linear polarization state P1 is perpendicular to a direction of the second linear polarization state P2). At this time, the external ambient light EB2 is absorbed by the band-pass polarizing pattern 132 due to that a polarization direction of the second linear polarization state P2 thereof is parallel to the axial direction of the absorption axis A of the band-pass polarizing pattern 132. Since an effect and principle of the band-pass polarizing pattern 133 and the quarter-wave plate 120 on the external ambient light EB3 are similar to the effect and principle (for example, an absorption effect) of the band-pass polarizing pattern 132 and the quarter-wave plate 120 on the external ambient light EB2, detail thereof is not repeated.

In the embodiment, an average transmittance of a combination of the band-pass polarizing pattern and the quarter-wave plate 120 to external ambient light with a wavelength outside the specific wavelength range and passing through the above combination twice may be less than an average transmittance of the external ambient light of the prior art, for example, the average transmittance of the external ambient light may be less than 20%. For example, an average transmittance of a combination of the quarter-wave plate 120 and the band-pass polarizing pattern 131 to external ambient light with a wavelength outside the wavelength range of 620±10 nm and passing through the above combination twice is less than the average transmittance of the external ambient light of the prior art, for example, less than 20% (as shown by a curve C1' of FIG. 4). An average transmittance of a combination of the quarter-wave plate 120 and the band-pass polarizing pattern 132 to external ambient light with a wavelength outside the wavelength range of 530±10 nm and passing through the above combination twice is less than 20% (as shown by a curve C2' of FIG. 4). An average transmittance of a combination of the quarter-wave plate 120 and the band-pass polarizing pattern 133 to external ambient light with a wavelength outside the wavelength range of 460±10 nm and passing through the above combination twice is less than 20% (as shown by a curve C3' of FIG. 4).

For example, when the external ambient light is light from a standard D65 light source (as shown by a curve D65 in FIG. 5), the compositions of different wavelengths thereof may be absorbed by different band-pass polarizing patterns. For example, the combination of the band-pass polarizing pattern 131 and the quarter-wave plate 120 is used to absorb a light composition with a wavelength outside the wavelength range of 620±10 nm (as shown by a curve C1" in FIG. 5). The combination of the band-pass polarizing pattern 132 and the quarter-wave plate 120 is used to absorb a light composition with a wavelength outside the wavelength range of 530±10 nm (as shown by a curve C2" in FIG. 5). The combination of the band-pass polarizing pattern 133 and the quarter-wave plate 120 is used to absorb a light composition with a wavelength outside the wavelength range of 460±10 nm (as shown by a curve C3" in FIG. 5).

Based on the above description, after a part of the external ambient light with a specific wavelength (such as the red wavelength, the green wavelength or the blue wavelength) passes through the quarter-wave plate 120 and the band-pass polarizing layer 130 twice, about two-thirds of the part of light (calculated roughly based on an area ratio) is absorbed by the band-pass polarizing layer 130, and only about one-third of the part of light may be reflected back to the external environment by the first electrode layer E1 of the display device 10. Therefore, when a part or all of the light-emitting structures of the display device 10 are not enabled to respectively present a partially dark state or an entire black screen, through the arrangement of the aforementioned quarter-wave plate 120 and the band-pass polarizing layer 130, the problem that the external ambient light is reflected by the reflective electrode (i.e., the first electrode layer E1) of the display device 10 and perceived by human eyes may be effectively mitigated. Namely, the overall reflectivity of the display device 10 to the external ambient light may be effectively reduced, which helps to improve the display quality (for example, dark state performance) of the display device 10.

On the other hand, since the band-pass polarizing light pattern still has an average transmittance of greater than 50% to light within a specific wavelength range, and the technical solution of the prior art only has an average transmittance of about 40% to light within the specific wavelength range, compared to the conventional technical solution using circular polarizers (i.e., the prior art), the light energy loss generated by the light emitted by the light-emitting structures (such as the light LB1, the light LB2, and the light LB3) after passing through the band-pass polarizing layer 130 is significantly reduced. For example, in the embodiment, a transmittance of the band-pass polarizing pattern 131 to the red light with a main light-emitting wavelength of 620 nm is about 2.1 times of that of the prior art (as shown by a curve C4 and a curve C4p in FIG. 6, where the curve C4 is a transmittance curve of the invention, and the curve Cp4 is a transmittance curve of the prior art). A transmittance of the band-pass polarizing pattern 132 to the green light with a main light-emitting wavelength of 530 nm is about 2.1 times of that of the prior art (as shown by curves C5 and C5p in FIG. 6). A transmittance of the band-pass polarizing pattern 133 to the blue light with a main light-emitting wavelength of 460 nm is about 1.7 times of that of the prior art (as shown by curves C6 and C6p in FIG. 6). In other words, the aforementioned arrangement of the quarter-wave plate 120 and the band-pass polarizing layer 130 may not only reduce the overall reflectivity of the display device 10 to external ambient light, but may also effectively increase the light energy utilization rate of the display device 10.

Some other embodiments are provided below to describe the invention in detail, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 7:
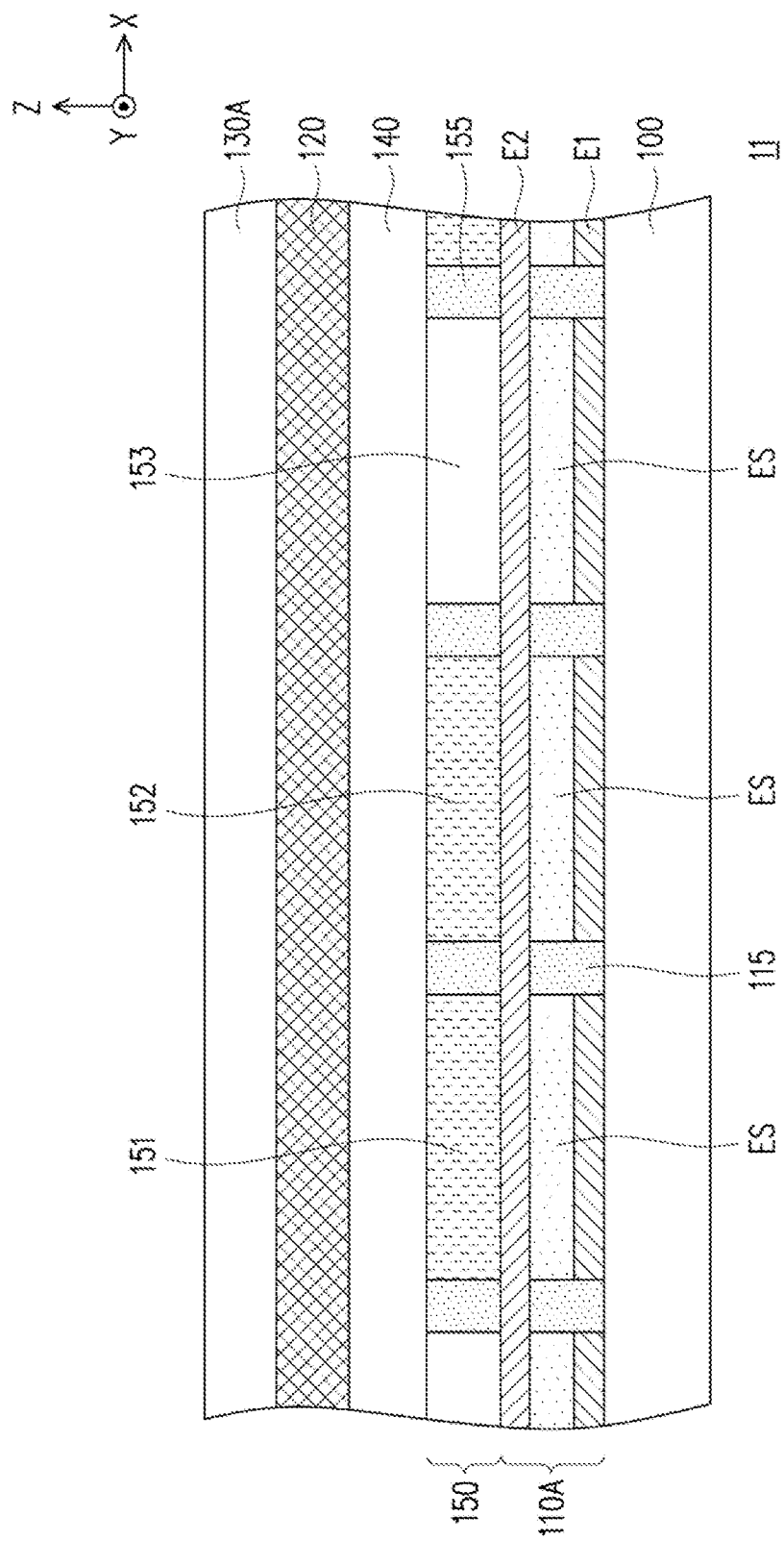
FIG. 7 is a schematic cross-sectional view of a display device according to a second embodiment of the invention.

FIG. 7 is a schematic cross-sectional view of a display device according to a second embodiment of the invention. Referring to FIG. 7, a main difference between a display device 11 of the embodiment and the display device 10 of FIG. 1A lies in a different arrangement of the band-pass polarizing layer. To be specific, a band-pass polarizing layer 130A of the display device 11 does not have a plurality of zones corresponding to the plurality of band-pass polarizing patterns of FIG. 1A. Namely, multiple portions of the band-pass polarizing layer 130A of the embodiment that are overlapped with the multiple light-emitting structures all have the same spectral characteristics. For example, in the embodiment, the band-pass polarizing layer 130A is suitable for allowing the red light (for example, 620±10 nm in wavelength), the green light (for example, 530±10 nm in wavelength), and the blue light (for example, 460±10 nm in wavelength) to pass through, i.e., the average transmittances to light within multiple specific wavelength ranges are respectively greater than 50%, and the average transmittance to light outside the above wavelength ranges is less than 50%, where the above wavelength ranges are overlapped with each other. In another embodiment, the band-pass polarizing layer 130A is suitable for allowing the red light (for example, 620±10 nm in wavelength), the green light (for example, 530±10 nm in wavelength), or the blue light (for example, 460±10 nm in wavelength) to pass through, i.e., the highest transmittance to light within a specific wavelength range is greater than 45%, and the average transmittance to light outside the specific wavelength range is less than 45%. In other embodiments, the wavelength range where the transmittance of the band-pass polarizing layer 130A is greater than 50% may be smaller than that of the band-pass polarizing layer 130 of FIG. 1A (for example, the main light-emitting wavelength±5 nm). Accordingly, the overall reflectivity of the display device 11 to external ambient light may be further reduced.

On the other hand, the display device 11 of the embodiment further includes a wavelength conversion layer 150 located between the light-emitting structures ES and the band-pass polarizing layer 130A, specifically, between the encapsulation layer 140 and the light-emitting layer 110. For example, the wavelength conversion layer 150 may include a plurality of wavelength conversion patterns, a plurality of light-transmitting patterns 153 and an isolation structure layer 155. The isolation structure layer 155 is disposed between the wavelength conversion patterns and the light-transmitting patterns 153. The wavelength conversion patterns and the light-transmitting patterns 153 are overlapped with the light-emitting structures ES of the light-emitting layer 110A in the direction Z, i.e., the isolation structure layer 155 is overlapped with the isolation structure layer 115 in the direction Z.

In the embodiment, light-emitting colors (or light-emitting wavelengths) of the light-emitting structures ES of the light-emitting layer 110A are substantially the same, for example, blue. The wavelength conversion patterns include a plurality of wavelength conversion patterns 151 and a plurality of wavelength conversion patterns 152. The wavelength conversion patterns 151, the wavelength conversion patterns 152, and the light-transmitting patterns 153 are sequentially arranged in alternation along the direction X. For example, a part of the blue light from the light-emitting structures ES may be absorbed by the wavelength conversion pattern 151 and the wavelength conversion pattern 152 to respectively generate red and green light with wavelengths different from that of the blue light, while the other part of the blue light may directly pass through the light-transmitting pattern 153 without generating any substantial light energy loss, but the invention is not limited thereto. In other embodiments, the wavelength conversion layer may also have a plurality of opening regions to replace the plurality of light-transmitting patterns 153.

It should be particularly noted that through the wavelength conversion effect of the wavelength conversion layer 150, a full width at half maximum (FWHM) of light intensity of display light to wavelength distribution is further reduced, thereby reducing the light energy loss generated when the display light passes through the band-pass polarizing layer 130A. In other words, the light energy utilization rate of the display device 11 may be further improved. On the other hand, since the light-emitting structures ES are all made of the same material, the service life (color decay) is more consistent, it is less likely to cause color shift along with the service life.

Figure 8:
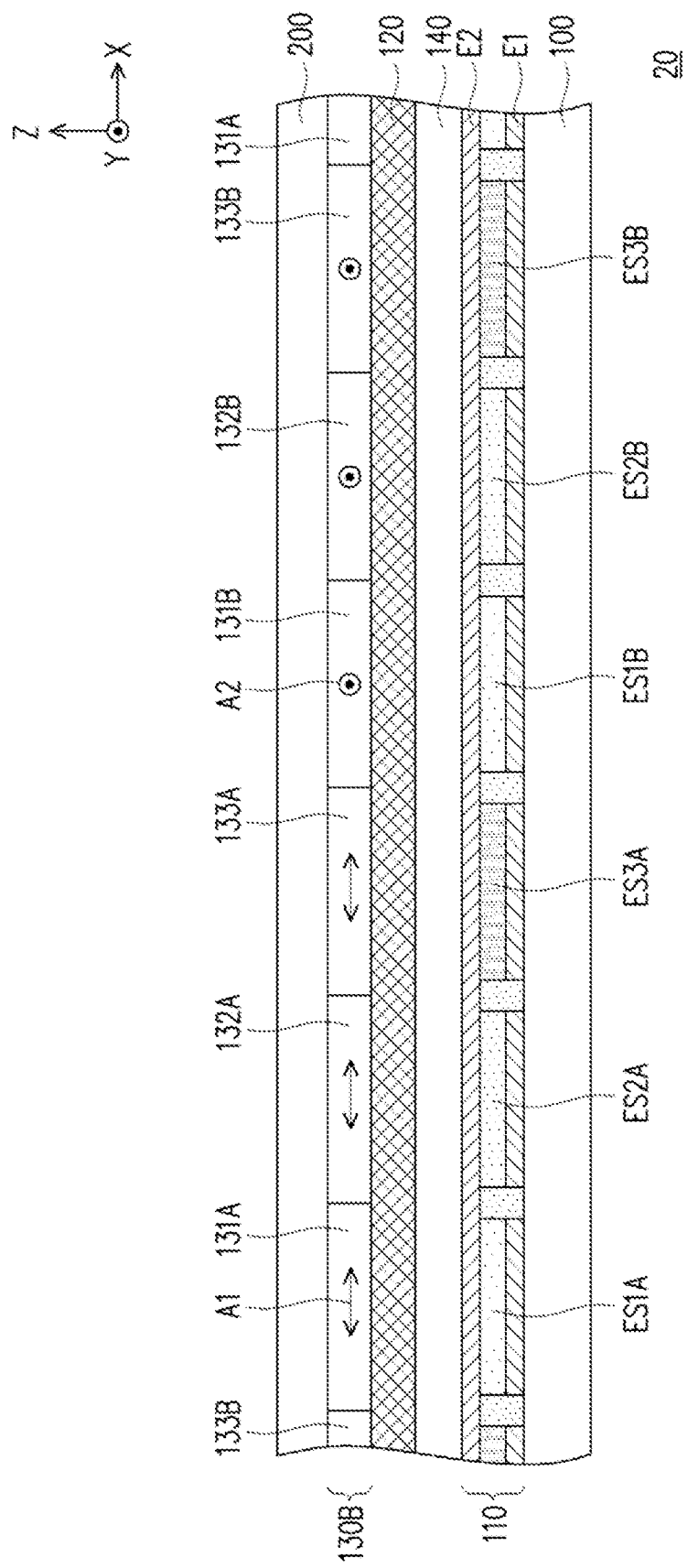
FIG. 8 is a schematic cross-sectional view of a display device according to a third embodiment of the invention.
Figure 9:
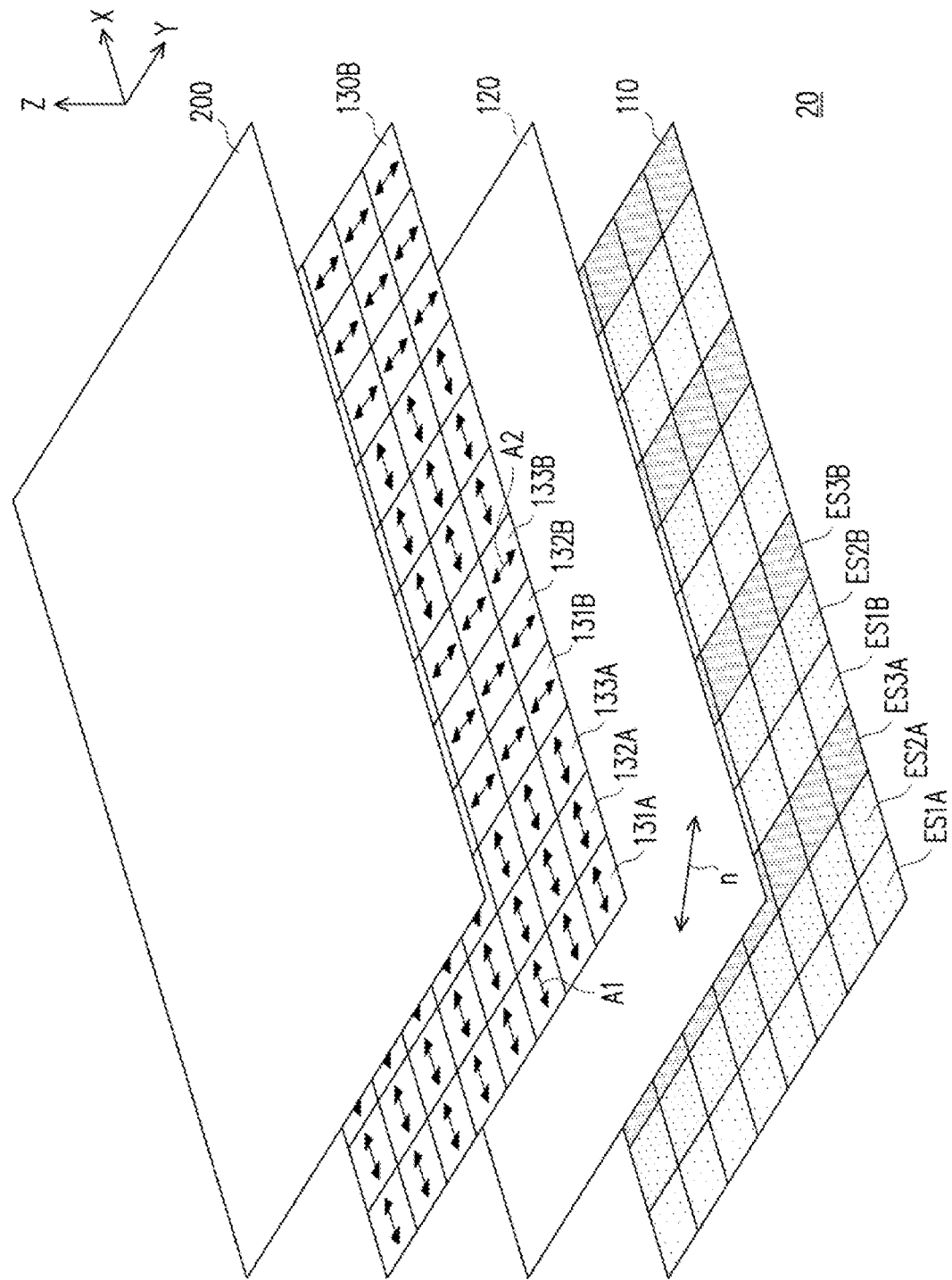
FIG. 9 is a schematic diagram of a part of film layers of the display device of FIG. 8.
Figure 10:
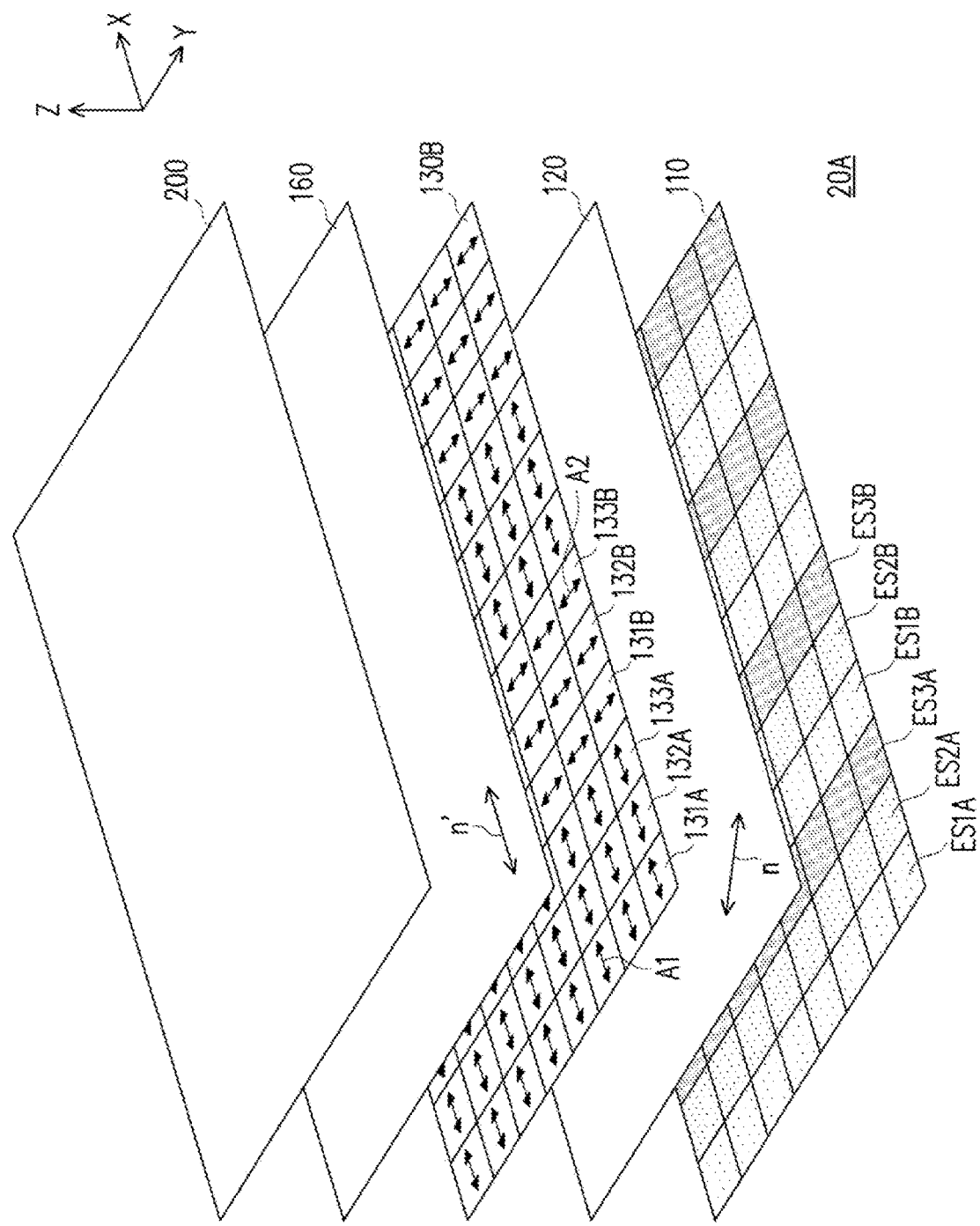
FIG. 10 is a schematic diagram of another varied embodiment of the display device of FIG. 9.

FIG. 8 is a schematic cross-sectional view of a display device according to a third embodiment of the invention. FIG. 9 is a schematic diagram of a part of film layers of the display device of FIG. 8. FIG. 10 is a schematic diagram of another varied embodiment of the display device of FIG. 9. Referring to FIG. 8 and FIG. 9, a difference between a display device 20 of the embodiment and the display device 10 of FIG. 1A lies in a different composition of the display device. More specifically, the display device 20 of the embodiment further has a function of anti-peep display.

In the embodiment, the display device 20 may further selectively include a viewing angle limiter 200, which is disposed in overlap with a band-pass polarizing layer 130B. The band-pass polarizing layer 130B is located between the viewing angle limiter 200 and the quarter-wave plate 120. For example, the viewing angle limiter 200 has a first absorption coefficient in a thickness direction (for example, the direction Z) and a second absorption coefficient in a direction perpendicular to the thickness direction, where a ratio of the first absorption coefficient to the second absorption coefficient may be between 2 and 10,000. In a preferred embodiment, the ratio of the first absorption coefficient to the second absorption coefficient of the viewing angle limiter 200 is between 10 and 1000.

In the embodiment, the light-emitting layer 110 may include a plurality of first pixel light-emitting structures and a plurality of second pixel light-emitting structures arranged in alternation along the direction X. The first pixel light-emitting structures are, for example, a plurality of first light-emitting structures ES1A, a plurality of second light-emitting structures ES2A, and a plurality of third light-emitting structures ES3A. The second pixel light-emitting structures are, for example, a plurality of first light-emitting structures ES1B, a plurality of second light-emitting structures ES2B, and a plurality of third light-emitting structures ES3B. The first light-emitting structures ES1A, the second light-emitting structures ES2A, the third light-emitting structures ES3A, the first light-emitting structures ES1B, the second light-emitting structures ES2B, and the third light-emitting structures ES3B are arranged in alternation along the direction X.

Particularly, the band-pass polarizing layer 130B includes a first pixel band-pass polarizing pattern and a second pixel band-pass polarizing pattern arranged in alternation along the direction X. The first pixel band-pass polarizing pattern is, for example, a plurality of first band-pass polarizing patterns 131A, a plurality of first band-pass polarizing patterns 132A, and a plurality of first band-pass polarizing patterns 133A. The second pixel band-pass polarizing pattern is, for example, a plurality of second band-pass polarizing patterns 131B, a plurality of second band-pass polarizing patterns 132B, and a plurality of second band-pass polarizing patterns 133B. In the direction Z, the first pixel band-pass polarizing pattern and the second pixel band-pass polarizing pattern are respectively overlapped with the first pixel light-emitting structures and the second pixel light-emitting structures, i.e., the first band-pass polarizing patterns are respectively disposed in overlap with a part of the first light-emitting structures and a part of the second light-emitting structures, and the second band-pass polarizing patterns are respectively disposed in overlap with the other part of the first light-emitting structures and the other part of the second light-emitting structures. To be specific, the first band-pass polarizing patterns 131A, the first band-pass polarizing patterns 132A, the first band-pass polarizing patterns 133A, the second band-pass polarizing patterns 131B, the second band-pass polarizing patterns 132B, and the second band-pass polarizing patterns 133B are respectively overlapped with the first light-emitting structures ES1A, the second light-emitting structures ES2A, the third light-emitting structures ES3A, the first light-emitting structures ES1B, the second light-emitting structures ES2B, and the third light-emitting structures ES3B in the direction Z.

In the embodiment, an axial direction of the absorption axis A1 of the first band-pass polarizing patterns is perpendicular to an axial direction of the absorption axis A2 of the second band-pass polarizing patterns, and an included angle between the absorption axis A or the absorption axis A2 and an optical axis n of the quarter-wave plate 120 is 45 degrees. Through the arrangement of the viewing angle limiter 200 and a zone design of the axial directions of the absorption axes of the band-pass polarizing patterns, the display device 20 may have an anti-peep display effect in the direction X or the direction Y. To be specific, the display device 20 may enable the first pixel light-emitting structures and the second pixel light-emitting structures, only enable the first pixel light-emitting structures, or only enable the second pixel light-emitting structures, so that the display device 20 may be respectively operated in a sharing mode, an X-direction anti-peep mode or a Y-direction anti-peep mode.

Referring to FIG. 10, in another embodiment, a display device 20A with the anti-peep display function may further selectively include a phase retardation film 160 disposed between the viewing angle limiter 200 and the band-pass polarizing layer 130B, and an axial direction of an optical axis n' of the phase retardation film 160 is parallel or perpendicular to the axial directions of the absorption axes of the band-pass polarizing layer 130B. For example, the axial direction of the optical axis n' of the phase retardation film 160 is parallel to the axial direction of the absorption axis A1 of the first band-pass polarizing patterns and perpendicular to the axial direction of the absorption axis A2 of the second band-pass polarizing patterns, but the invention is not limited thereto.

Figure 11:
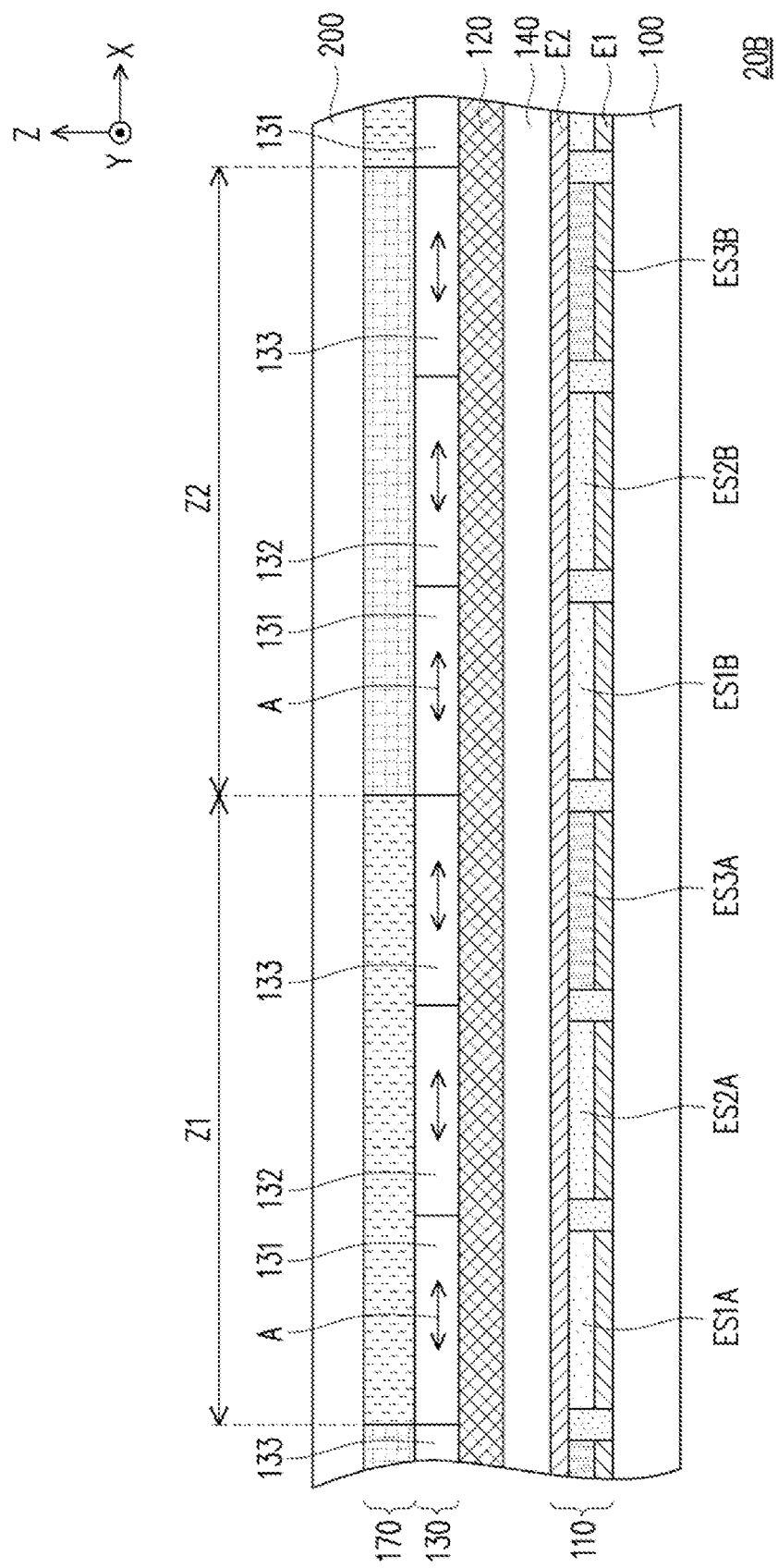
FIG. 11 is a schematic cross-sectional view of a display device according to a fourth embodiment of the invention.
Figure 12:
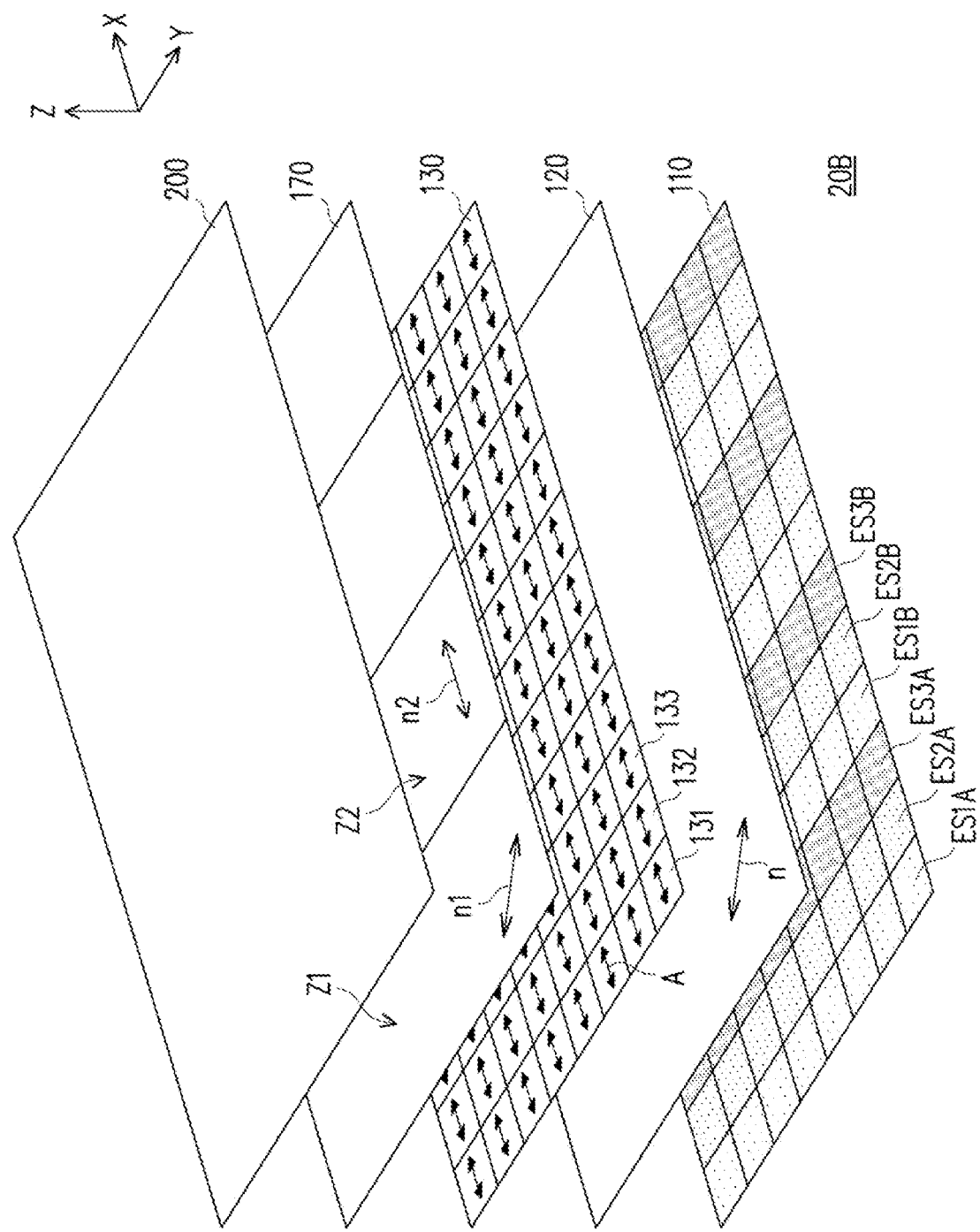
FIG. 12 is a schematic diagram of a part of film layers of the display device of FIG. 11.

FIG. 11 is a schematic cross-sectional view of a display device according to a fourth embodiment of the invention. FIG. 12 is a schematic diagram of a part of film layers of the display device of FIG. 11. Referring to FIG. 11 and FIG. 12, a difference between a display device 20B of the embodiment and the display device 20 of FIG. 8 lies in a different axial direction configuration of the absorption axis of the band-pass polarizing layer. To be specific, the display device 20B adopts the same band-pass polarizing layer 130 as that shown in FIG. 2 (i.e., the axial directions of the absorption axes A of the plurality of band-pass polarizing patterns of the band-pass polarizing layer 130 are all the same).

The display device 20B further includes a half-wave plate 170 disposed in overlap with the band-pass polarizing layer 130 and located between the viewing angle limiter 200 and the band-pass polarizing layer 130. Particularly, the half-wave plate 170 has a plurality of first zones Z1 and a plurality of second zones Z2. The first zones Z1 are respectively overlapped with a plurality of first pixel light-emitting structures (for example, the first light-emitting structure ES1A, the second light-emitting structure ES2A, and the third light-emitting structure ES3A) in the direction Z, and the second zones Z2 are respectively overlapped with a plurality of second pixel light-emitting structures (for example, the first light-emitting structure ES1B, the second light-emitting structure ES2B, and the third light-emitting structure ES3B).

In the embodiment, an included angle between a first optical axis n1 of the first zone Z1 of the half-wave plate 170 and the absorption axis A of the band-pass polarizing pattern is 45 degrees, and an axial direction of a second optical axis n2 of the second zone Z2 of the half-wave plate 170 is parallel to an axial direction of the absorption axis A of the band-pass polarizing pattern. However, the invention is not limited thereto. In another embodiment, the axial direction of the second optical axis n2 of the second zone Z2 of the half-wave plate 170 may also be perpendicular to the axial direction of the absorption axis A of the band-pass polarizing pattern. In still another embodiment, the second zone Z2 of the half-wave plate 170 is an opening region (or filled with light-transmitting material), i.e., the second zone Z2 does not need to be provided with a material of the half-wave plate.

In summary, in the display device of an embodiment of the invention, the side of the quarter-wave plate away from the light-emitting layer is provided with the band-pass polarizing layer. The plurality of first band-pass polarizing patterns of the band-pass polarizing layer have an average transmittance of greater than 50% to the light within a specific wavelength range, while in the visible light range, the first band-pass polarizing patterns have an average transmittance of less than 20% to the light with a wavelength being outside the specific wavelength range and a polarization direction being parallel to the absorption axis of the first band-pass polarizing patterns, and have a polarizing effect to the light. In this way, in addition to increasing an overall light output of the display device, an overall reflectivity of the display device to external ambient light is also reduced, thereby improving the light energy utilization rate and a dark state performance of the display device.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display device, comprising a circuit substrate, a light-emitting layer, a quarter-wave plate, and a band-pass polarizing layer, wherein
   the light-emitting layer is disposed on the circuit substrate and has a plurality of light-emitting structures, the light-emitting structures are disposed in overlap with the circuit substrate and are electrically connected to the circuit substrate, the light-emitting structures comprise a plurality of first light-emitting structures, and the first light-emitting structures have a first main light-emitting wavelength;
   the quarter-wave plate is disposed in overlap with the light-emitting structures of the light-emitting layer; and
   the band-pass polarizing layer is disposed in overlap with the quarter-wave plate, wherein the quarter-wave plate is located between the band-pass polarizing layer and the light-emitting layer, the band-pass polarizing layer comprises at least one of first band-pass polarizing pattern, the at least one of first band-pass polarizing pattern has a first absorption axis, a first wavelength range is the first main light-emitting wavelength±10 nm, and within a range of visible light, an average transmittance of the at least one of first band-pass polarizing pattern to light with a wavelength outside the first wavelength range and a polarization direction being parallel to the first absorption axis is less than 20%.

2. The display device as claimed in claim 1, wherein an included angle between an optical axis of the quarter-wave plate and the first absorption axis of the band-pass polarizing layer is 45 degrees.

3. The display device as claimed in claim 1, wherein the light-emitting structures further comprise a plurality of second light-emitting structures, the second light-emitting structures have a second main light-emitting wavelength, the first main light-emitting wavelength is different from the second main light-emitting wavelength, the band-pass polarizing layer further comprises a plurality of second band-pass polarizing patterns, the at least one of first band-pass polarizing pattern comprises a plurality of first band-pass polarizing patterns, the first band-pass polarizing patterns are respectively disposed in overlap with the first light-emitting structures, the second band-pass polarizing patterns are respectively disposed in overlap with the second light-emitting structures, and an average transmittance of the second band-pass polarizing patterns to light with a wavelength within a second wavelength range is greater than 50%, wherein the second wavelength range is the second main light-emitting wavelength±10 nm.

4. The display device as claimed in claim 3, wherein the light-emitting structures further comprise a plurality of third light-emitting structures, the third light-emitting structures have a third main light-emitting wavelength, the band-pass polarizing layer further comprises a plurality of third band-pass polarizing patterns, the third band-pass polarizing patterns are respectively disposed in overlap with the third light-emitting structures, wherein the first main light-emitting wavelength is greater than 600 nm, the second main light-emitting wavelength is between 500 nm and 600 nm, and the third main light-emitting wavelength is less than 500 nm.

5. The display device as claimed in claim 1, wherein the light-emitting layer further comprises a first electrode layer, the first electrode layer is electrically connected to the light-emitting structures, the first electrode layer is located between the light-emitting structures and the circuit substrate, and the first electrode layer is a reflective electrode layer.

6. The display device as claimed in claim 3, wherein each of the second band-pass polarizing patterns has the first absorption axis, and the first absorption axes of the first band-pass polarizing patterns and the second band-pass polarizing patterns have a same axial direction.

7. The display device as claimed in claim 1, wherein the at least one of first band-pass polarizing pattern comprises a plurality of first band-pass polarizing patterns, the first absorption axes of the first band-pass polarizing patterns have different axial directions.

8. The display device as claimed in claim 1, wherein average transmittances of the at least one of first band-pass polarizing pattern to light with wavelengths within the first wavelength range, the second wavelength range, and the third wavelength range are respectively greater than 50%, and an average transmittance to light with wavelengths outside the first wavelength range, the second wavelength range, and the third wavelength range is less than 50%, wherein the first wavelength range, the second wavelength range, and the third wavelength range are not overlapped with each other.

9. The display device as claimed in claim 8, further comprising:
a plurality of wavelength conversion patterns, disposed in overlap with at least a part of the light-emitting structures and located between the light-emitting structures and the band-pass polarizing layer.

10. The display device as claimed in claim 9, further comprising:
a plurality of light-transmitting patterns, disposed in overlap with at least another part of the light-emitting structures and located between the light-emitting structures and the band-pass polarizing layer.

11. The display device as claimed in claim 1, wherein the at least one of first band-pass polarizing pattern has a highest transmittance of greater than 45% to light with a wavelength within the first wavelength range.

12. The display device as claimed in claim 1, wherein the at least one of first band-pass polarizing pattern has an average transmittance greater than 50% to light with a wavelength within the first wavelength range.

* * * * *